United States Patent
Li et al.

(10) Patent No.: US 11,955,796 B2
(45) Date of Patent: Apr. 9, 2024

(54) ELECTROSTATIC DISCHARGE NETWORK FOR DRIVER GATE PROTECTION

(71) Applicant: Apple Inc., Cupertino, CA (US)

(72) Inventors: Junjun Li, Newton, MA (US); Abbas Komijani, Mountain View, CA (US); Hongrui Wang, San Jose, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 17/661,503

(22) Filed: Apr. 29, 2022

(65) Prior Publication Data

US 2023/0352932 A1 Nov. 2, 2023

(51) Int. Cl.
*H02H 9/04* (2006.01)
*H01L 27/02* (2006.01)

(52) U.S. Cl.
CPC ......... *H02H 9/046* (2013.01); *H01L 27/0255* (2013.01)

(58) Field of Classification Search
CPC .............................. H02H 9/046; H01L 27/0255
USPC ........................................................... 361/56
See application file for complete search history.

(56) References Cited

U.S. PATENT DOCUMENTS

| | | | |
|---|---|---|---|
| 6,249,410 B1 * | 6/2001 | Ker | H02H 9/046 361/111 |
| 7,450,358 B2 | 11/2008 | Gossner | |
| 8,228,651 B2 * | 7/2012 | Kim | H01L 27/0266 361/56 |
| 9,130,562 B2 * | 9/2015 | Mallikarjunaswamy | H02H 9/046 |
| 9,293,912 B2 * | 3/2016 | Parthasarathy | H02H 9/04 |
| 9,871,373 B2 * | 1/2018 | O'Donnell | H02H 9/042 |
| 11,626,725 B2 * | 4/2023 | Sun | H03K 19/0005 361/56 |
| 11,689,014 B2 * | 6/2023 | Krishnamoorthy | H02H 9/02 361/111 |
| 11,731,418 B2 * | 8/2023 | Cleare | B41J 2/04541 347/11 |
| 2003/0076636 A1 | 4/2003 | Ker et al. | |
| 2006/0018063 A1 * | 1/2006 | Boezen | H01L 27/0255 361/56 |
| 2006/0132996 A1 * | 6/2006 | Poulton | H01L 27/0255 361/56 |
| 2007/0267701 A1 * | 11/2007 | Sung | H01L 27/0266 257/365 |
| 2011/0026173 A1 * | 2/2011 | Karp | H01L 27/0266 361/56 |
| 2013/0342940 A1 * | 12/2013 | Taghizadeh Kaschani | H02H 9/046 361/56 |

(Continued)

FOREIGN PATENT DOCUMENTS

WO WO-2023283009 A1 * 1/2023 ......... H01L 27/0255

*Primary Examiner* — Dharti H Patel
(74) *Attorney, Agent, or Firm* — Kowert, Hood, Munyon, Rankin & Goetzel, P.C.; Dean M. Munyon

(57) ABSTRACT

An output circuit included in an integrated circuit may employ multiple protection circuits to protect driver devices from damage during an electrostatic discharge event. One protection circuit clamps a signal port to a ground supply node upon detection of the electrostatic discharge event. Another protection circuit increases the voltage level of a control terminal to one of the driver devices during the electrostatic discharge event to reduce the voltage across the driver device and prevent damage to the device.

20 Claims, 12 Drawing Sheets

(56) References Cited

U.S. PATENT DOCUMENTS

| | | | |
|---|---|---|---|
| 2015/0077886 A1* | 3/2015 | Chen | H02H 9/046 |
| | | | 361/56 |
| 2015/0214731 A1* | 7/2015 | Tsurui | H02H 9/046 |
| | | | 327/109 |
| 2015/0333508 A1* | 11/2015 | Ko | H01L 23/60 |
| | | | 361/56 |
| 2015/0380397 A1* | 12/2015 | Dabral | H01L 27/0255 |
| | | | 361/56 |
| 2020/0219867 A1* | 7/2020 | Grad | H04L 25/0272 |
| 2020/0256961 A1* | 8/2020 | Gaalema | G01S 7/4817 |
| 2021/0408786 A1* | 12/2021 | Dundigal | H03K 17/0822 |
| 2023/0148160 A1* | 5/2023 | Sivakumar | H02H 9/046 |
| | | | 361/56 |
| 2023/0208965 A1* | 6/2023 | Choulos | H04M 3/007 |
| | | | 361/119 |

* cited by examiner

ELECTROSTATIC DISCHARGE NETWORK FOR DRIVER GATE PROTECTION

BACKGROUND

Technical Field

This disclosure relates to electrostatic discharge in computer systems and, more particularly, to protection circuits used to move charge off an integrated circuit during an electrostatic discharge event.

Description of the Related Art

Modern computer systems may include multiple integrated circuits configured to perform various tasks. For example, a computer system may include integrated circuits that include processor circuits, memory circuits, analog/mixed-signal circuits, radio-frequency circuits, and the like. Once such integrated circuits have been manufactured, they may be mounted on circuit boards or substrates, that are then assembled with other sub-assemblies, e.g., power supplies, displays, etc., to form a computer system.

During manufacturing, mounting, and assembly processes, static charge can build up on equipment used in the processes. The static charge can be transferred to input/output ports of the integrated circuits in what is referred to as an electrostatic discharge (or "ESD") event. When static charge is transferred to the input/output ports of an integrated circuit, the charge can propagate along conduction paths within the integrated circuit generating high voltages that can damage devices included in the integrated circuit, possibly rendering the integrated circuit unusable.

Various measures are used to reduce the risk of static charge being transferred to the input/output ports of an integrated circuit during the manufacturing, mounting, and assembly processes. For example, integrated circuits may be transferred from one piece of equipment to another using conductive trays that inhibit the buildup of static charge. Additionally, equipment and equipment operators may be ground to provide conduction paths to ground for any static charge that accumulates. To further protect integrated circuits from damage, protection circuits can be included in an integrated circuit that provide conduction paths out of the integrated circuit for any charge transferred to an input/output port of the integrated circuit during an ESD event.

SUMMARY OF THE EMBODIMENTS

Various embodiments for protecting an output circuit included in an integrated circuit are disclosed. Broadly speaking, an output circuit includes a power supply port of an integrated circuit, where the power supply port is coupled to an internal power supply node via a first resistor. A driver circuit is configured to generate, using a data signal and a voltage level of a regulated power supply node, an output signal on a signal port of the integrated circuit. A first protection circuit is configured to couple the signal port to the internal power supply node in response to a detection of an electrostatic discharge event on the signal port, and a second protection circuit that is coupled to the internal power supply node is configured, in response to the detection of the electrostatic discharge event, to increase a voltage level of an input to the driver circuit.

DETAILED DESCRIPTION OF EMBODIMENTS

Figure 1:
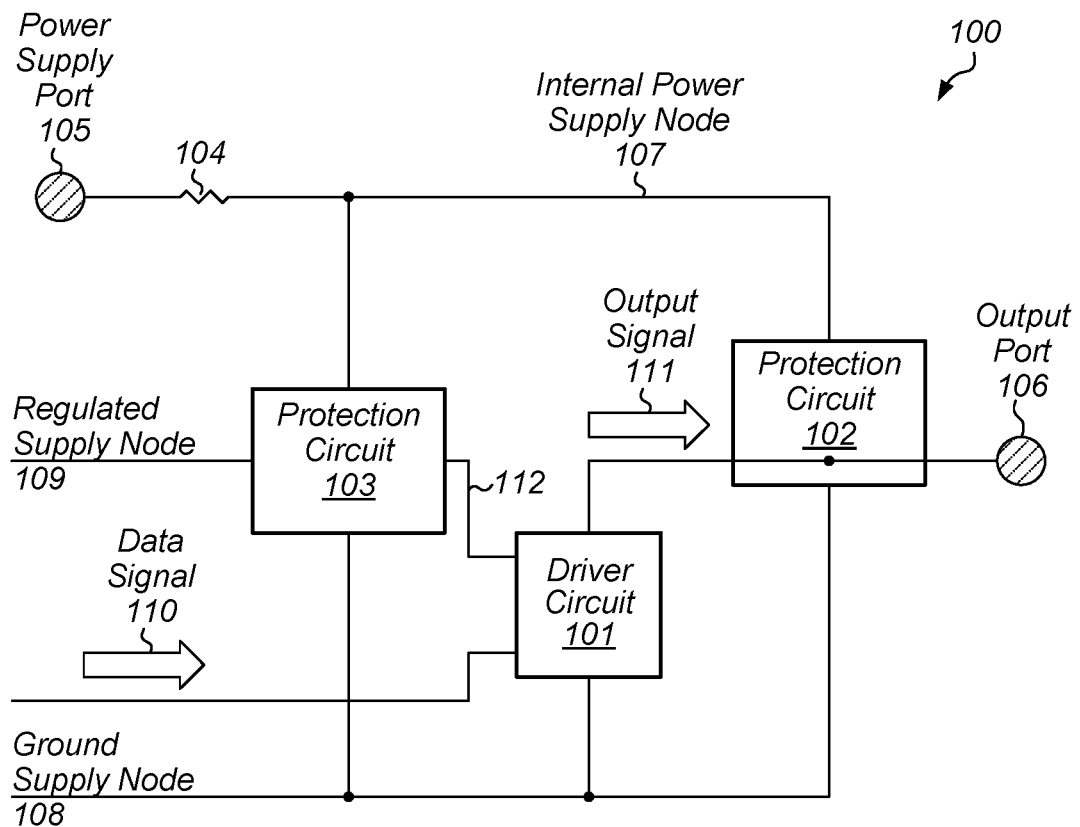
FIG. 1 is a block diagram of an embodiment of an integrated circuit output driver circuit that includes electrostatic discharge protection (ESD) circuits.

Many computer systems include multiple integrated circuits that transmit signals between each other using conductive traces on a circuit board or other suitable substrate. To transmit such signals, an integrated circuit includes multiple output circuits or input/output (IO) circuits that are coupled to corresponding conductive traces via conductive pads, bumps, balls, and the like. Such circuits receive data to be transmitted from other circuit blocks within an integrated circuit, and then convert the received data into voltage or current levels that can propagate to another integrated circuit via a conductive trace.

Output circuits and IO circuits often include transistors, or other suitable devices, that are connected to a pad, bump, or ball. Connecting transistors to output structures such as a ball or bump can result in the transistors being susceptible to damage during manufacturing and assembly operations. In particular, transistors connected to output structures can be susceptible to damage resulting from an electrostatic discharge (ESD) event in which there is a buildup of static electricity on manufacturing equipment, workers, etc. In such events, static electricity is transferred to an output structure of an integrated circuit, causing large voltages and/or currents to develop within the integrated circuit. This buildup can damage oxides of transistors coupled to the output structure, momentarily melt metal traces in the integrated circuit, and the like.

Damage caused by an ESD event can render an integrated circuit unusable. Since such damage often occurs during the final assembly stages of a computer system, the cost to replace a damaged integrated circuit can be high. Moreover, in some cases, repair or replacement may not be practical. To prevent damage caused by ESD events, integrated circuits employ protection circuits whose function is to provide a conduction path that allows charge transferred to an output structure during an ESD event to flow out of the integrated circuit through a power supply before any damage is done.

Some computer systems rely on high-speed signaling between different integrated circuits coupled to a common circuit board or substrate. To achieve the desired bandwidth on such high-speed signaling interfaces, high-performance metal-oxide semiconductor field-effect transistors ("MOS-FETs" or simply "transistors") are used to implement output driver circuits. Such high-performance transistors are implemented with short channel lengths and thin gate oxide layers to allow for rapid switching between conductive and non-conductive states.

The short channel lengths and thin gate oxides of high-performance transistors make them more susceptible to damage resulting from excessive voltage. For example, applying too large of a voltage to a gate of a high-performance transistor can damage the gate oxide resulting in a short from the gate of the transistor to either of the source or drain of the transistor. With high-performance transistors being more susceptible to damage from over-voltage conditions, the use of such high-performance transistors further increases the sensitivity of an input/output circuit or output circuit to ESD events.

High-speed interfaces can also employ reduced signal swing to achieve the desired bandwidth. To maintain an adequate signal-to-noise ratio, an internal power supply node for output circuits may be isolated from a primary power supply node by a resistor or other suitable circuit element to reduce an amount of switching noise present on the primary power supply node from being transferred to the output signal. Isolating the internal supply can, however, reduce a protection circuit's effectiveness by detouring the ESD protection path needed to conduct transferred charge away from sensitive circuits, therefore resulting in elevated clamping voltage during an ESD event.

The embodiments illustrated in the drawings and described below may provide techniques for an ESD protection scheme that employs a secondary protection circuit that protects an output transistor included in a driver circuit by providing a secondary conduction path to move energy out of an integrated circuit during an ESD event. The current flowing through the secondary conduction path can be used to temporarily increase the voltage level at gate terminals of the output transistors, which limits the voltage between the output transistors gate and drain terminals, reducing the likelihood of damage to the output transistor, A block diagram of an embodiment of an output circuit is depicted in FIG. 1. As illustrated, output circuit 100 includes driver circuit 101, protection circuit 102, protection circuit 103, and resistor 104. It is noted that multiple instances of output circuit 100 may be included on an integrated circuit in order to transmit data to other integrated circuits within a computer system.

Power supply port 105 is coupled, via resistor 104, to internal power supply node 107. In various embodiments, internal power supply node 107 is isolated from power supply port 105 in this fashion to reduce the sensitivity of circuits coupled to internal power supply node 107 from noise present on power supply port 105. Although depicted as a single resistor, in other embodiments, resistor 104 may be implemented as any suitable series and/or parallel combinations of resistors. In various embodiments, resistor 104 may be implemented using polysilicon, diffusion, metal, or any other suitable material available on a semiconductor manufacturing process.

Driver circuit 101 is configured to generate, using data signal 110 and a voltage level of regulated power supply node 109, output signal 111 on output port 106. As described below, driver circuit 101 may, in various embodiments, employ multiple devices configured to sink current from output port 106 to generate output signal 111. In various embodiments, output port 106 may be coupled to an input port of another integrated circuit via a conductive trace on a circuit board or other suitable substrate.

Protection circuit 102 is configured to couple output port 106 to internal power supply node 107 and ground supply node 108 in response to a detection of an electrostatic discharge event on output port 106. In various embodiments, the electrostatic discharge event may be a result of static charge accumulated on test or manufacturing equipment being transferred to output port 106. The transferred charge can increase the voltage level of output port 106 beyond a threshold value, at which point, protection circuit 102 couples output port 106 to internal power supply node 107 and ground supply node 108 to provide a conduction path for the transferred charge away from output port 106.

Protection circuit 103 is coupled to internal power supply node 107 and is configured, in response to the detection of the electrostatic discharge event, to increase a voltage level of node 112 that is coupled to an input to driver circuit 101. When the electrostatic discharge event begins, the voltage on output port 106 increases, which increases the voltage across devices in driver circuit 101, possibly to the point of damaging the devices. By increasing the voltage level on node 112 during the electrostatic discharge event, the voltage difference across devices in driver circuit 101 is reduced, limiting the potential for damage to the devices in driver circuit 101.

As described below, protection circuit 103 is configured to provide a conduction path from ground supply node 108 to regulated power supply node 109. As current flows from ground supply node 108 to regulated power supply node 109, protection circuit 103 is configured to use the current to increase the voltage level on node 112.

As noted above, during the electrostatic discharge event, a conduction path is formed by protection circuit 102 to allow charge transferred to output port 106 to move to internal power supply node 107. As the charge moves to internal power supply node 107, the voltage level of internal power supply node 107 increases. Resistor 104 prevents the charge from rapidly moving off the integrated circuit via power supply port 105. Since the charge cannot rapidly move out through power supply port 105, additional power clamp circuits may be employed to provide additional conduction paths to the transferred charge to exit the integrated circuit before devices are damaged.

Figure 2:
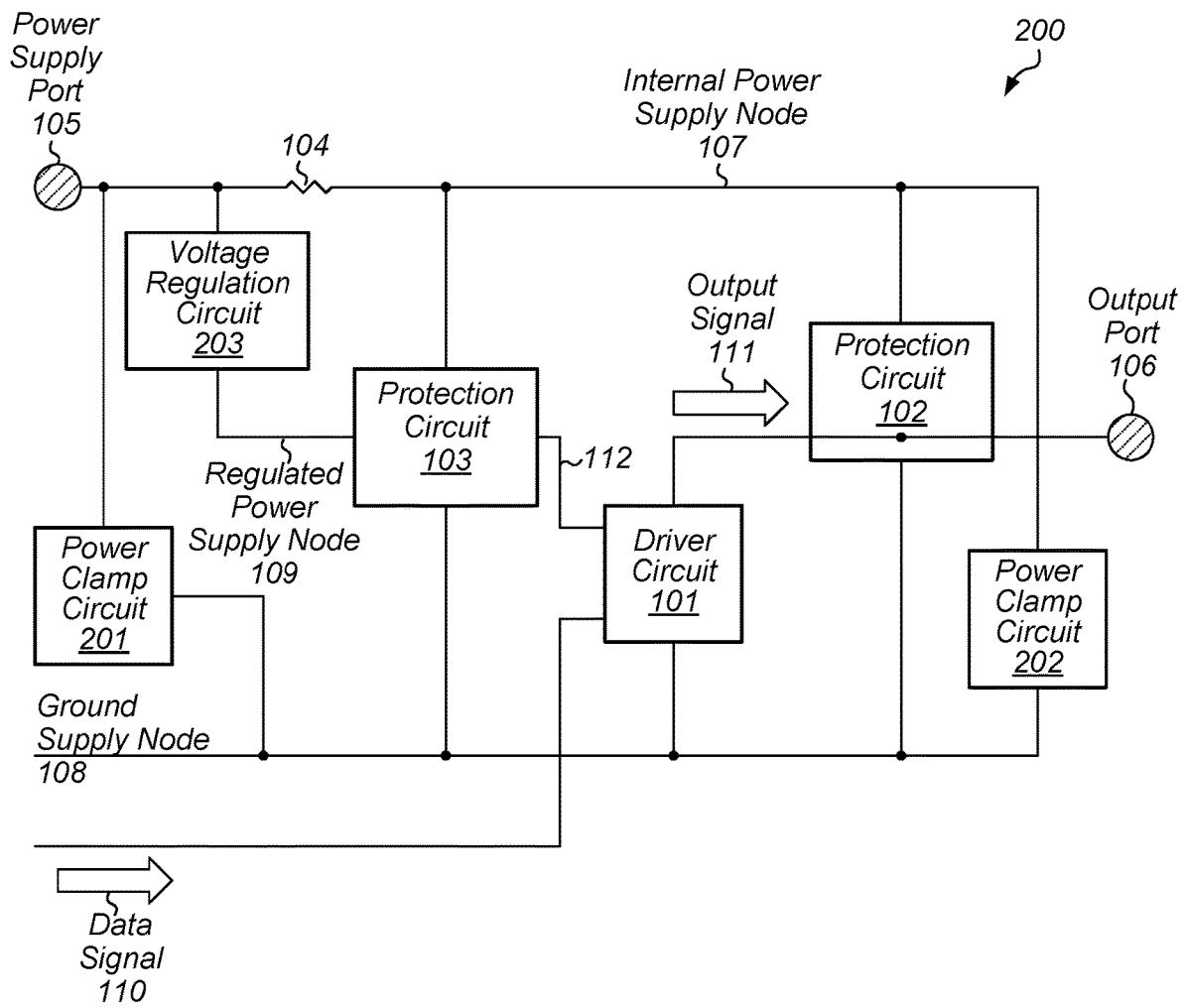
FIG. 2 is a block diagram of an embodiment of an integrated circuit output driver circuit that includes a power clamp circuit.

A block diagram of an embodiment of an output circuit that includes power clamp circuits is depicted in FIG. 2. As illustrated, output circuit 200 includes driver circuit 101, protection circuit 102, protection circuit 103, resistor 104, power clamp circuit 201, power clamp circuit 202, and regulator circuit 203. It is noted that driver circuit 101, protection circuit 102, protection circuit 103, and resistor 104 are configured to function as described above in regard to FIG. 1.

Power clamp circuit 201 is coupled between power supply port 105 and ground supply node 108. In various embodiments, power clamp circuit 201 is configured to couple power supply port 105 to ground supply node 108 in response to a detection of an electrostatic discharge event on power supply port 105, during which charge that has accumulated on manufacturing or test equipment is transferred to power supply port 105. By coupling power supply port 105 to ground supply node 108 during the electrostatic discharge event, power clamp circuit 201 provides a conduction path for the transferred charge to exit the integrated circuit via ground supply node 108.

Power clamp circuit 202 is coupled between internal power supply node 107 and ground supply node 108. In various embodiments, power clamp circuit 202 is configured to couple internal power supply node 107 to ground supply node 108 in response to a determination that the voltage level of internal power supply node 107 is greater than a threshold level.

As described above, during an electrostatic discharge event on output port 106 during which charge is transferred to output port 106 increasing the voltage level on output port 106, protection circuit 102 is configured to couple output port 106 to internal power supply node 107 allowing the charge on output port 106 to be transferred to internal power supply node 107. As the charge moves onto internal power supply node 107, the voltage level of internal power supply node 107 increases, triggering power clamp circuit 202. Once internal power supply node 107 is coupled to ground supply node 108, the charge now accumulated on internal power supply node 107 can flow into ground supply node 108. As described below, the influx of charge into ground supply node 108 can result in a temporary increase in the voltage level of ground supply node 108, which can activate protection circuit 103.

Regulator circuit 203 is coupled to power supply port 105 and is configured to generate a particular voltage level on regulated power supply node 109. In various embodiments, regulator circuit 203 may be implemented as a low-dropout (LDO) regulator circuit that includes a variable conductance coupled between power supply port 105 and regulated power supply node 109. The value of the variable conductance may be adjusted based on a comparison between a voltage level of regulated power supply node 109 and a reference voltage. In some embodiments, regulator circuit 203 is further configured to provide a conductance path to power supply port 105 for current drawn from ground supply node 108 by protection circuit 103 during an electrostatic discharge event on output port 106. It is noted that, in other embodiments, other types of regulator circuits, e.g., switched-capacitor regulator circuits, may be employed.

Figure 3:
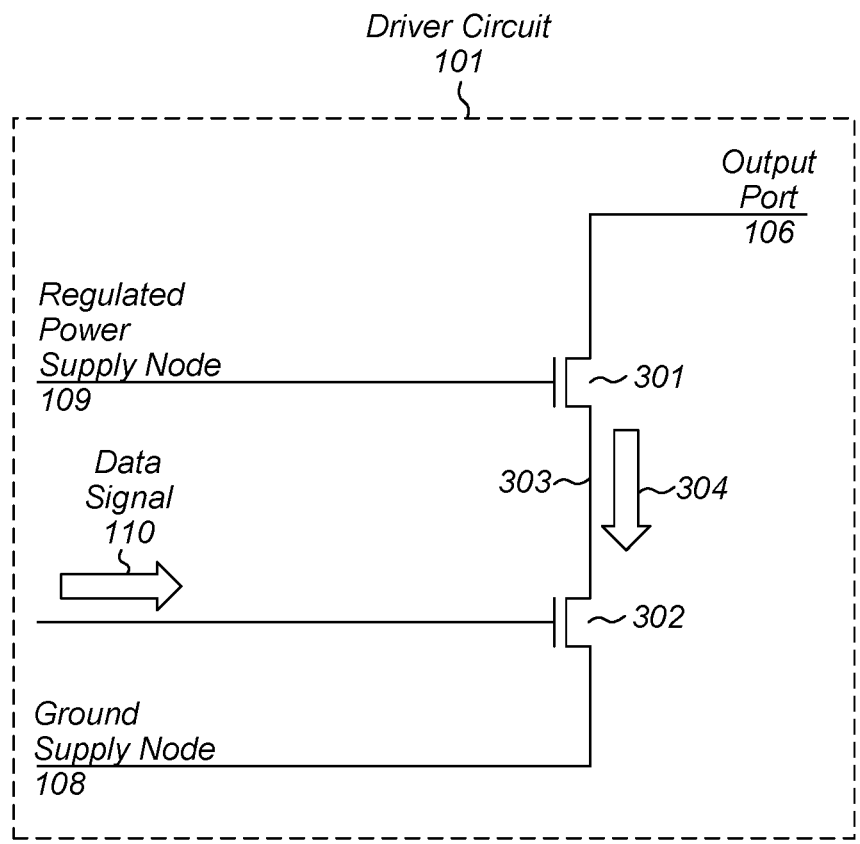
FIG. 3 is a block diagram of an embodiment of a driver circuit for an integrated circuit output driver circuit.

A block diagram of an embodiment of driver circuit 101 is depicted in FIG. 3. As illustrated, driver circuit 101 includes devices 301 and 302. Device 301 is coupled between output port 106 and node 303, while device 302 is coupled between node 303 and ground supply node 108.

A control terminal of device 301 is connected to regulated power supply node 109. In various embodiments, a voltage level of regulated power supply node 109 determines a conductance of device 301.

Device 302 is configured to couple node 303 to ground supply node 108 based on data signal 110. In various embodiments, device 302 is configured to couple node 303 to ground supply node 108 in response to a determination that data signal 110 is at a high-logic level, and de-couple node 303 from ground supply node 108 in response to a determination that data signal 110 is at a low-logic level.

When device 302 is active and node 303 is coupled to ground supply node 108, current 304 is sunk from output port 106. A value of current 304 is determined based on the voltage level of regulated power supply node 109. By sinking current 304 from output port 106, the voltage level of output port 106 decreases. The decrease in the voltage of output port 106 can propagate along a conductive trace on a circuit board or substrate to another integrated circuit whose receiver circuits can interpret the change in voltage as a change in the logic value of a signal being transmitted via output port 106.

Devices 301 and 302 may, in various embodiments, be implemented as n-channel MOSFETs, FinFETs, GAAFETs, or any other suitable transconductance devices. Although devices 301 and 302 are depicted in FIG. 3 as being single devices, in other embodiments, devices 301 and 302 may include multiple devices coupled in parallel.

Figure 4:
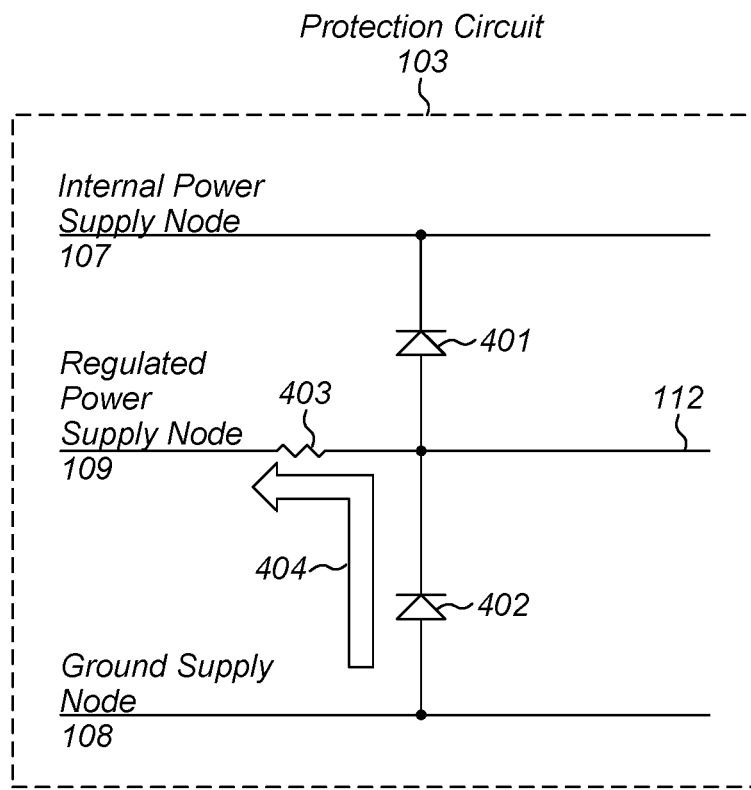
FIG. 4 is a block diagram of an embodiment of an ESD protection circuit for an integrated circuit output driver circuit.

Turning to FIG. 4, a block diagram of an embodiment of protection circuit 103 is depicted. As illustrated, protection circuit 103 includes diode 401, diode 402, and resistor 403. The cathode of diode 401 is coupled to internal power supply node 107 and the anode of diode 401 is coupled to node 112. The cathode of diode 402 is coupled to node 112, while the anode of diode 402 is coupled to ground supply node 108. Resistor 403 is coupled between node 112 and regulated power supply node 109.

During typical operation, a voltage level of node 112 is between ground potential and a voltage level of internal power supply node 107 resulting in diodes 401 and 402 being reversed bias. In the event of a high-voltage spike on output port 106, energy can be diverted through power supply clamp circuits into ground supply node 108 causing the voltage level of ground supply node 108 to increase. Such an increase in the voltage level of ground supply node 108 can forward bias diode 402 allowing current 404 to flow through diode 402 and resistor 403 into regulated power supply node 109 and ultimately into power supply port 105 as described above.

As current 404 flows through resistor 403, a voltage is developed across resistor 403 causing the voltage of node 112 to increase. As described above, an increase in the voltage level of node 112 reduces the gate-to-drain voltage across device 301 during an ESD, thereby reducing the likelihood of damage to device 301. Should the voltage level of node 112 increase beyond the voltage of internal power supply node 107, diode 401 becomes forward biased and begins to conduct current from node 112 into internal power supply node 107.

Although diodes 401 and 402 are depicted as single diodes, in other embodiments, either of diodes 401 or 402 may include multiple diodes. For example, diode 401 may include multiple diodes connected in series between node 112 and internal power supply node 107. Alternatively, diode 401 may include multiple diodes connected in parallel between node 112 and internal power supply node 107.

Diodes 401 and 402 may, in various embodiments, be implemented as diode-connected MOSFETs. Alternatively, in other embodiments, diodes 401 and 402 may be implemented as vertical PN junctions such as N-type silicon implanted in a region of P-type silicon, or any other suitable type of PN structure available in a semiconductor manufacturing process.

Resistor 403 may be implemented using polysilicon, metal, or any other suitable material available in a semiconductor manufacturing process. In other embodiments, resistor 403 may be implemented using one or more pass devices (e.g., an n-channel or p-channel MOSFET), a capacitor, or an inductor.

Figure 5:
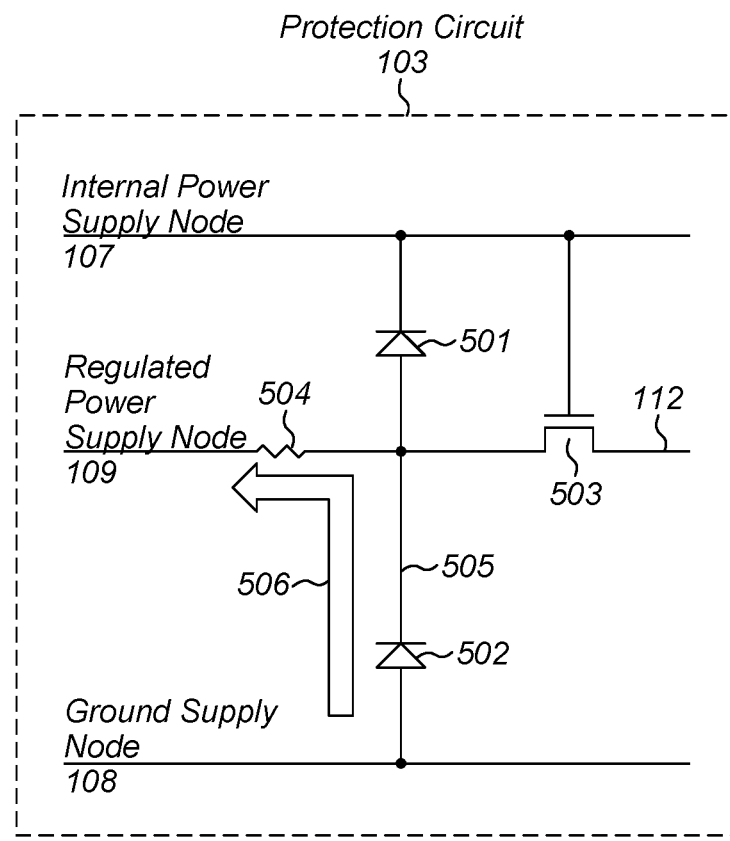
FIG. 5 is a block diagram of a different embodiment of an ESD protection circuit for an integrated circuit output driver circuit.

A block diagram of another embodiment of protection circuit 103 is depicted in FIG. 5. As illustrated, protection circuit 103 includes diode 501, diode 502, device 503, and resistor 504.

The cathode of diode 501 is coupled to internal power supply node 107 and the anode of diode 501 is coupled to node 505. The cathode of diode 502 is coupled to node 505, while the anode of diode 502 is coupled to ground supply node 108. Resistor 504 is coupled between node 505 and regulated power supply node 109. Device 503 is coupled between node 505 and node 112. A control terminal of device 503 is coupled to internal power supply node 107, activating device 503.

During typical operation, a voltage level of node 505 is between ground potential and a voltage level of internal power supply node 107 resulting in diodes 501 and 502 being reversed bias. In the event of a high-voltage spike on output port 106, energy can be diverted through power supply clamp circuits into ground supply node 108 causing the voltage level of ground supply node 108 to increase. Such an increase in the voltage level of ground supply node 108 can forward bias diode 502, allowing current 506 to flow through diode 502 into resistor 504.

As current 506 flows into node 505, respective voltages are developed across resistor 504 and device 503, resulting in an increase in the voltage level of node 112. As described above, an increase in the voltage level of node 112 reduces the gate-to-drain voltage across device 301 during an ESD, thereby reducing the likelihood of damage to device 301. Should the voltage level of node 505 increase beyond the voltage of internal power supply node 107, diode 501 becomes forward biased and begins to conduct current from node 505 into internal power supply node 107.

Diodes 501 and 502 may, in various embodiments, be implemented as diode-connected MOSFETs. Alternatively, in other embodiments, diodes 501 and 502 may be implemented as vertical PN junctions, such as N-type silicon implanted in a region of P-type silicon, or any other suitable type of PN structure available in a semiconductor manufacturing process.

Resistor 504 may be implemented using polysilicon, metal, or any other suitable material available in a semiconductor manufacturing process. In other embodiments, resistor 504 may be implemented using one or more pass devices (e.g., an n-channel or p-channel MOSFET), a capacitor, or an inductor.

Device 503 may be implemented as an n-channel MOSFET or any other suitable transconductance device. It is noted that although device 503 is depicted as a single device, in other embodiments, device 503 may be implemented using any suitable series and/or parallel combination of devices.

Figure 6:
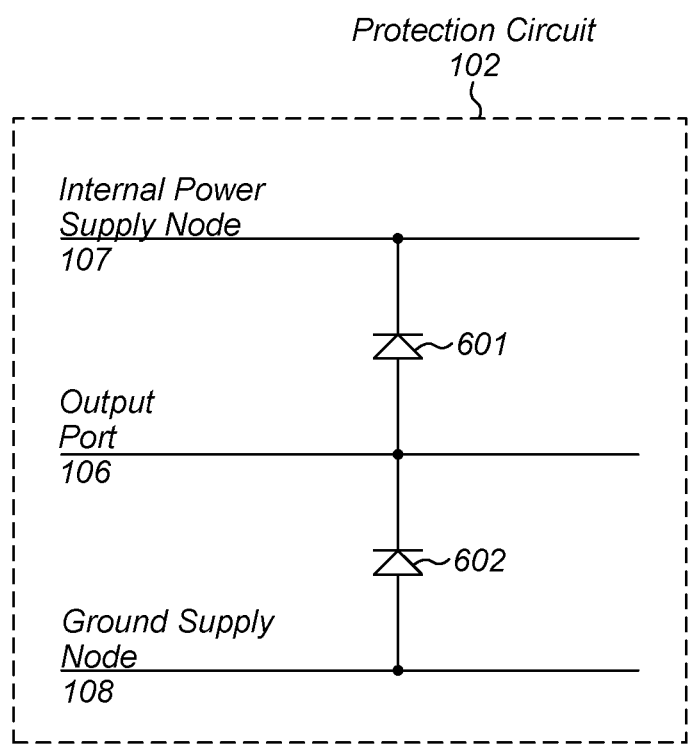
FIG. 6 is a block diagram of another embodiment of an ESD protection circuit for an integrated circuit output driver circuit.

Turning to FIG. 6, a block diagram of an embodiment of protection circuit 102 is depicted. As illustrated, protection circuit 102 includes diodes 601 and 602. The cathode of diode 601 is coupled to internal power supply node 107 and the anode of diode 601 is coupled output port 106. The cathode of diode 602 is coupled to output port 106, while the anode of diode 602 is coupled to ground supply node 108.

During typical operation, a voltage level of output port 106 is between ground potential and a voltage level of internal power supply node 107 resulting in diodes 601 and 602 being reversed bias. In the event of a high-voltage spike on output port 106, diode 601 becomes forward biased allowing current to flow into internal power supply node 107 from output port 106, thereby protecting driver circuits coupled to output port 106. In the event of a low-voltage spike on output port 106, diode 602 becomes forward biased, diverting the spike to ground supply node 108, thereby protecting the driver circuits coupled to output port 106.

Although diodes 601 and 602 are depicted as single diodes, in other embodiments, either of diodes 601 or 602 may include multiple diodes. For example, diode 601 may include multiple diodes connected in series between output port 106 and internal power supply node 107. Alternatively, diode 601 may include multiple diodes connected in parallel between output port 106 and internal power supply node 107.

Diodes 601 and 602 may, in various embodiments, be implemented as diode-connected MOSFETs. Alternatively, in other embodiments, diodes 601 and 602 may be implemented as vertical PN junctions, such as N-type silicon implanted in a region of P-type silicon, or any other suitable type of PN structure available in a semiconductor manufacturing process.

Figure 7:
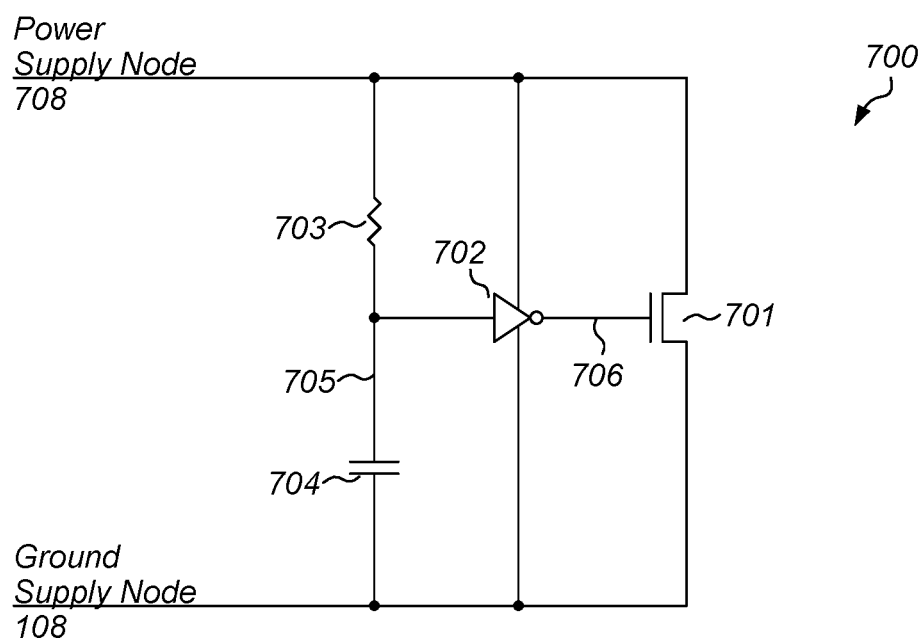
FIG. 7 is a block diagram of an embodiment of a power clamp circuit for an integrated circuit output driver circuit.

Turning to FIG. 7, a block diagram of a power clamp circuit is depicted. As illustrated, power clamp circuit 700 includes device 701, inverter 702, resistor 703, and capacitor 704. In various embodiments, power clamp circuit 700 may correspond to either of power clamp circuits 201 or 202 as depicted in FIG. 2.

Device 701 is coupled between power supply node 708 and ground supply node 108 and is configured to couple power supply node 708 to ground supply node 108 based on a voltage level of node 706. In various embodiments, device 701 may be implemented as an n-channel MOSFET, FinFET, GAAFET, or any other suitable switch device.

Inverter 702 is configured to generate a voltage level on node 706 based on a voltage level of node 705. Although inverter 702 is depicted as a single inverter, in other embodiments, inverter 702 may be implemented as a series chain of inverters. Using multiple inverters of increasing size may, in some embodiments, be used to provide sufficient drive strength to control device 701.

Resistor 703 is coupled between power supply node 708 and node 705. In various embodiments, resistor 703 may be implemented using polysilicon, metal, or any other suitable material available in a semiconductor manufacturing process. Alternatively, resistor 703 may be implemented using a MOSFET, FinFET, GAAFET, or the like, biased to provide a desired resistance between the source and drain terminals.

Capacitor 704 is coupled between node 705 and ground supply node 108. In various embodiments, capacitor 704 may be implemented using a metal-oxide-metal (MOM) structure, a metal-insulator-metal (MIM) structure, or any other suitable capacitor structure available in a semiconductor manufacturing process.

During steady-state operation, the voltage level of node 705 is substantially the same as the voltage level of power supply node 708, which results in a voltage at or near ground potential on node 706. With node 706 near ground potential, device 701 is inactive, preventing current flow from power supply node 708 to ground supply node 108.

During an ESD event, energy can be diverted into power supply node 708 by other protection circuits, such as protection circuit 102, which causes the voltage of power supply node 708 to increase. Resistor 703 and capacitor 704 increase the time constant of node 705 such that node 705 does not immediately respond to changes in the voltage level of power supply node 708. As the voltage level of power supply node 708 increases while the voltage level of node 705 remains the same, the trip point of inverter 702 changes, resulting in node 706 transitioning to a voltage level at or near the voltage level of power supply node 708. The increase in the voltage level of node 706 activates device 701, coupling power supply node 708 to ground supply node 108. Power supply node 708 can remain coupled to ground supply node 108 until the voltage of power supply node 708 returns to a level sufficient to cause inverter 702 to output a low voltage on node 706.

The embodiment depicted in FIG. 7 is one example of a clamp circuit. In other embodiments, other types of clamp circuits (e.g., gate-ground n-channel MOSFET clamp circuits, Zener diode coupled n-channel MOSFET clamp circuits, and the like) may be employed.

Figure 8:
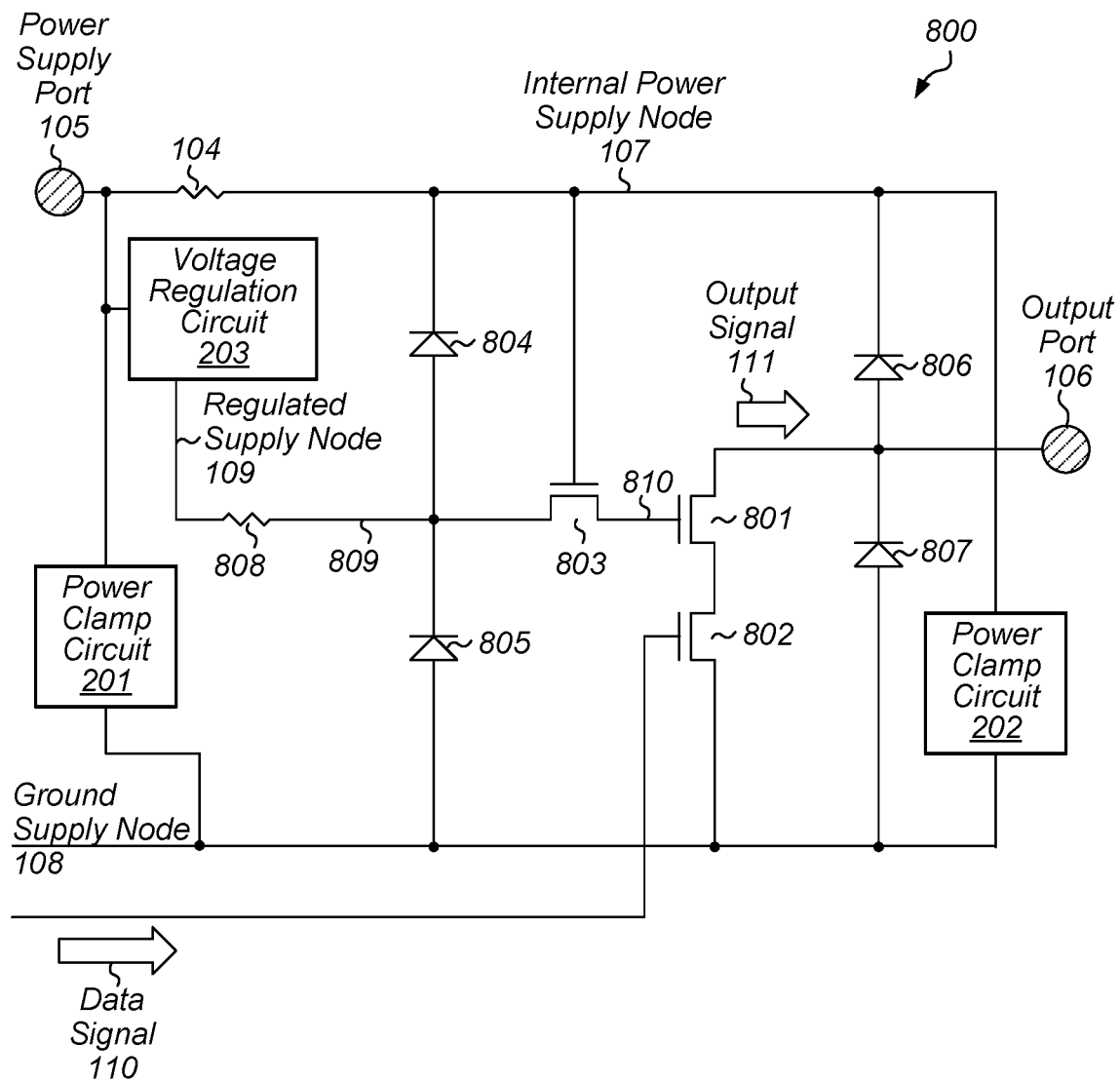
FIG. 8 is a block diagram of a different embodiment of an integrated circuit output driver circuit.

Turning to FIG. 8, a block diagram of a different embodiment of an output circuit is depicted. As illustrated, output circuit 800 includes resistor 104, power supply port 105, output port 106, power clamp circuits 201 and 202, voltage regulated circuit 203, device 801-803, diodes 804-807, and resistor 808.

Power clamp circuit 201 is coupled between power supply port 105 and ground supply node 108. In various embodiments, power clamp circuit 201 is configured to couple power supply port 105 to ground supply node 108 in response to a detection of an electrostatic discharge event on power supply port 105, during which charge that has accumulated on manufacturing or test equipment is transferred to power supply port 105. By coupling power supply port 105 to ground supply node 108 during the electrostatic discharge event, power clamp circuit 201 provides a conduction path for the transferred charge to exit the integrated circuit via ground supply node 108.

Power clamp circuit 202 is coupled between internal power supply node 107 and ground supply node 108. In various embodiments, power clamp circuit 202 is configured to couple internal power supply node 107 to ground supply node 108 in response to a determination that the voltage level of internal power supply node 107 is greater than a threshold level.

Power supply port 105 is coupled, via resistor 104, to internal power supply node 107. In various embodiments, internal power supply node 107 is isolated from power supply port 105 in this fashion to reduce the sensitivity of circuits coupled to internal power supply node 107 from noise present on power supply port 105. Although depicted as a single resistor, in other embodiments, resistor 104 may be implemented as any suitable series and/or parallel combinations of resistors. As described above, resistor 104 may be implemented using polysilicon, diffusion, metal, or any other suitable material available on a semiconductor manufacturing process.

Regulator circuit 203 is coupled to power supply port 105 and is configured to generate a particular voltage level on regulated power supply node 109. In various embodiments, regulator circuit 203 may be implemented as a low-dropout (LDO) regulator circuit that includes a variable conductance coupled between power supply port 105 and regulated power supply node 109. The value of the variable conductance may be adjusted based on a comparison between a voltage level of regulated power supply node 109 and a reference voltage. In some embodiments, regulator circuit 203 is further configured to provide a conductance path to power supply port 105 for current drawn from ground supply node 108 by diode 805 during an electrostatic discharge event on output port 106. It is noted that, in other embodiments, other types of regulator circuits, e.g., switched-capacitor regulator circuits, may be employed.

Device 801 is coupled to output port 106 and to device 802, and is controlled by a voltage on node 810. Device 802 is coupled between device 801 and ground supply node 108, and is controlled by data signal 108. Collectively, device 801 and device 802 generate output signal 111 by sinking a current from output port 106. In various embodiments, a value of the current is based on a voltage level of node 810 and a value of data signal 110. Device 803 is coupled between nodes 809 and 810. A control terminal of device 803 is coupled to internal power supply node 108, thereby activating device 803.

Devices 801-803 may be implemented as n-channel MOSFETs, FinFETs, GAAFETs, or any other suitable transconductance device. Although devices 801-803 are depicted as single devices in FIG. 8, in other embodiments, devices 801-803 may be implemented as series or parallel combinations of multiple devices.

The cathode of diode 806 is coupled to internal power supply node 107 and the anode of diode 806 is coupled output port 106. The cathode of diode 807 is coupled to output port 106, while the anode of diode 807 is coupled to ground supply node 108.

During typical operation, a voltage level of output port 106 is between ground potential and a voltage level of internal power supply node 107 resulting in diodes 806 and 807 being reversed bias. In the event of a high-voltage spike on output port 106, diode 806 becomes forward biased allowing current to flow into internal power supply node 107 from output port 106, thereby protecting driver circuits coupled to output port 106. In the event of a low-voltage spike on output port 106, diode 807 becomes forward biased, diverting the spike to ground supply node 108, thereby protecting the driver circuits coupled to output port 106.

The cathode of diode 804 is coupled to internal power supply node 107 and the anode of diode 804 is coupled to node 809. The cathode of diode 805 is coupled to node 809, while the anode of diode 805 is coupled to ground supply node 108. Resistor 808 is coupled between node 809 and regulated power supply node 109.

During typical operation, a voltage level of node 809 is between ground potential and a voltage level of internal power supply node 107 resulting in diodes 804 and 805 being reversed bias. In the event of a high-voltage spike on output port 106, energy can be diverted through power supply clamp circuit 202 into ground supply node 108 causing the voltage level of ground supply node 108 to increase. Such an increase in the voltage level of ground supply node 108 can forward bias diode 805 allowing a current to flow through diode 805 and resistor 808 into regulated power supply node 109 and ultimately into power supply port 105 as described above.

As current flows into node 809, respective voltages are developed across resistor 809 and device 803, resulting in an increase in the voltage level of node 810 and node 809. An increase in the voltage level of node 810 reduces the gate-to-drain voltage across device 801 during an ESD event, thereby reducing the likelihood of damage to device 801. Should the voltage level of node 809 increase beyond the voltage of internal power supply node 107, diode 804 becomes forward biased and begins to conduct current from node 809 into internal power supply node 107.

Although diodes 804-807 are depicted as single diodes, in other embodiments, any of diodes 804-807 may include multiple diodes. For example, diode 806 may include multiple diodes connected in series between output port 106 and internal power supply node 107. Alternatively, diode 806 may include multiple diodes connected in parallel between output port 106 and internal power supply node 107.

Diodes 804-807 may, in various embodiments, be implemented as diode-connected MOSFETs. Alternatively, in other embodiments, diodes 804-807 may be implemented as vertical PN junctions, such as N-type silicon implanted in a region of P-type silicon, or any other suitable type of PN structure available in a semiconductor manufacturing process.

Figure 9:
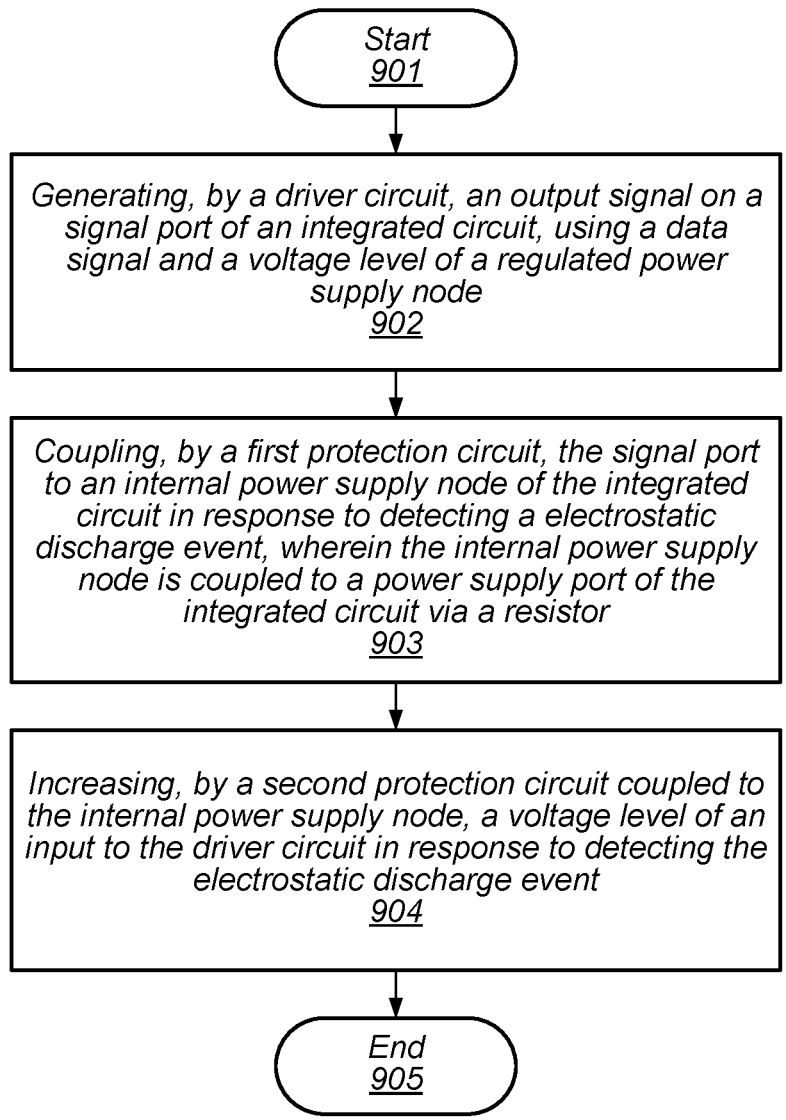
FIG. 9 is a flow diagram of an embodiment of a method for operating an integrated circuit output driver circuit.

Turning to FIG. 9, a flow diagram depicting an embodiment of a method for operating an output circuit during an ESD event is illustrated. The method, which may be applied to various output circuits including output circuit 100, begins in block 901.

The method includes generating, by a driver circuit, an output signal on a signal port of an integrated circuit using a voltage level of a regulated power supply node (block 902). In some embodiments, generating the output signal may include sinking a current from the signal port, where a value of the current is based on a data signal and the voltage level of the regulated power supply node.

In various embodiments, the method may further include generating, by a voltage regulator circuit, a particular voltage level on the regulated power supply node. In some cases, the voltage regulator circuit may include an LDO regulator circuit or other suitable voltage regulation circuit.

The method also includes coupling, by a first protection circuit, the signal port to an internal power supply node of the integrated circuit in response to detecting a electrostatic discharge event, where the internal power supply node is coupled to a power supply port of the integrated circuit via a resistor (block 903).

In some embodiments, the method may further include coupling, by a first power clamp circuit, the internal power supply node to a ground supply node in response to detecting the electrostatic discharge event. In other cases, the method may also include coupling, by a second power clamp circuit, the power supply port to the ground supply node in response to detecting the electrostatic discharge event.

The method further includes increasing, by a second protection circuit coupled to the internal power supply node, a voltage level of an input to the driver circuit in response to detecting the electrostatic discharge event (block 904).

As described above, coupling the internal power supply node to the ground supply node can increase the voltage level of the ground supply node, allowing current to be drawn from the ground supply node. Various techniques may be employed to use current drawn from the ground supply node. In some embodiments, the method may include coupling, by the second protection circuit using a diode, the regulated power supply node to the ground node in response to detecting the electrostatic discharge event.

In cases where the regulated power supply node is coupled to the ground supply node, the method may also include increasing, by the second protection circuit, the voltage level of the input to the driver circuit using current drawn from the ground supply node. In various embodiments, the method may further include routing the current drawn from the ground supply node to the power supply port. The method concludes in block 905.

Figure 10:
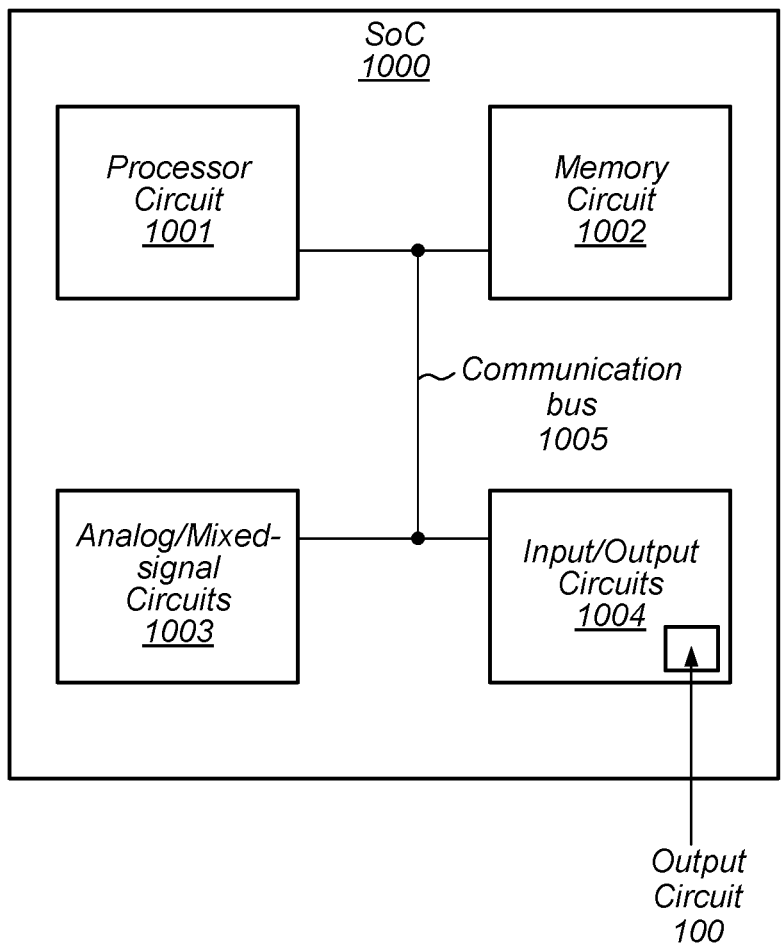
FIG. 10 is a block diagram of one embodiment of a system-on-a-chip that includes an output driver circuit.

A block diagram of a system-on-a-chip (SoC) is illustrated in FIG. 10. In the illustrated embodiment, SoC 1000 includes processor circuit 1001, memory circuit 1002, analog/mixed-signal circuits 1003, and input/output circuits 1004, each of which is coupled to communication bus 1005. In various embodiments, SoC 1000 may be configured for use in a desktop computer, server, or in a mobile computing application such as, e.g., a tablet, laptop computer, or wearable computing device.

Processor circuit 1001 may, in various embodiments, be representative of a general-purpose processor that performs computational operations. For example, processor circuit 1001 may be a central processing unit (CPU) such as a microprocessor, a microcontroller, an application-specific integrated circuit (ASIC), or a field-programmable gate array (FPGA).

Memory circuit 1002 may in various embodiments, include any suitable type of memory such as a Dynamic Random-Access Memory (DRAM), a Static Random-Access Memory (SRAM), a Read-Only Memory (ROM), Electrically Erasable Programmable Read-only Memory (EEPROM), or a non-volatile memory, for example. It is noted that although a single memory circuit is illustrated in FIG. 10, in other embodiments, any suitable number of memory circuits may be employed.

Analog/mixed-signal circuits 1003 may include a crystal oscillator circuit, a phase-locked loop circuit, an analog-to-digital converter (ADC) circuit, and a digital-to-analog converter (DAC) circuit (all not shown). In some embodiments, analog/mixed-signal circuits 1003 may include one or more sensor circuits configured to measure operating parameters (e.g., temperature) of SoC 1000.

Input/output circuits 1004 may be configured to coordinate data transfer between SoC 1000 and one or more peripheral devices. Such peripheral devices may include, without limitation, storage devices (e.g., magnetic or optical media-based storage devices including hard drives, tape drives, CD drives, DVD drives, etc.), audio processing subsystems, or any other suitable type of peripheral devices. In various embodiments, input/output circuits 1004 may include multiple output circuits such as output circuit 100. In some embodiments, input/output circuits 1004 may be configured to implement a version of Universal Serial Bus (USB) protocol or IEEE 1394 (Firewire®) protocol.

Input/output circuits 1004 may also be configured to coordinate data transfer between SoC 1000 and one or more devices (e.g., other computing systems or integrated circuits) coupled to SoC 1000 via a network. In one embodiment, input/output circuits 1004 may be configured to perform the data processing necessary to implement an Ethernet (IEEE 802.3) networking standard such as Gigabit Ethernet or 10-Gigabit Ethernet, for example, although it is contemplated that any suitable networking standard may be implemented. In some embodiments, input/output circuits 1004 may be configured to implement multiple discrete network interface ports.

Figure 11:
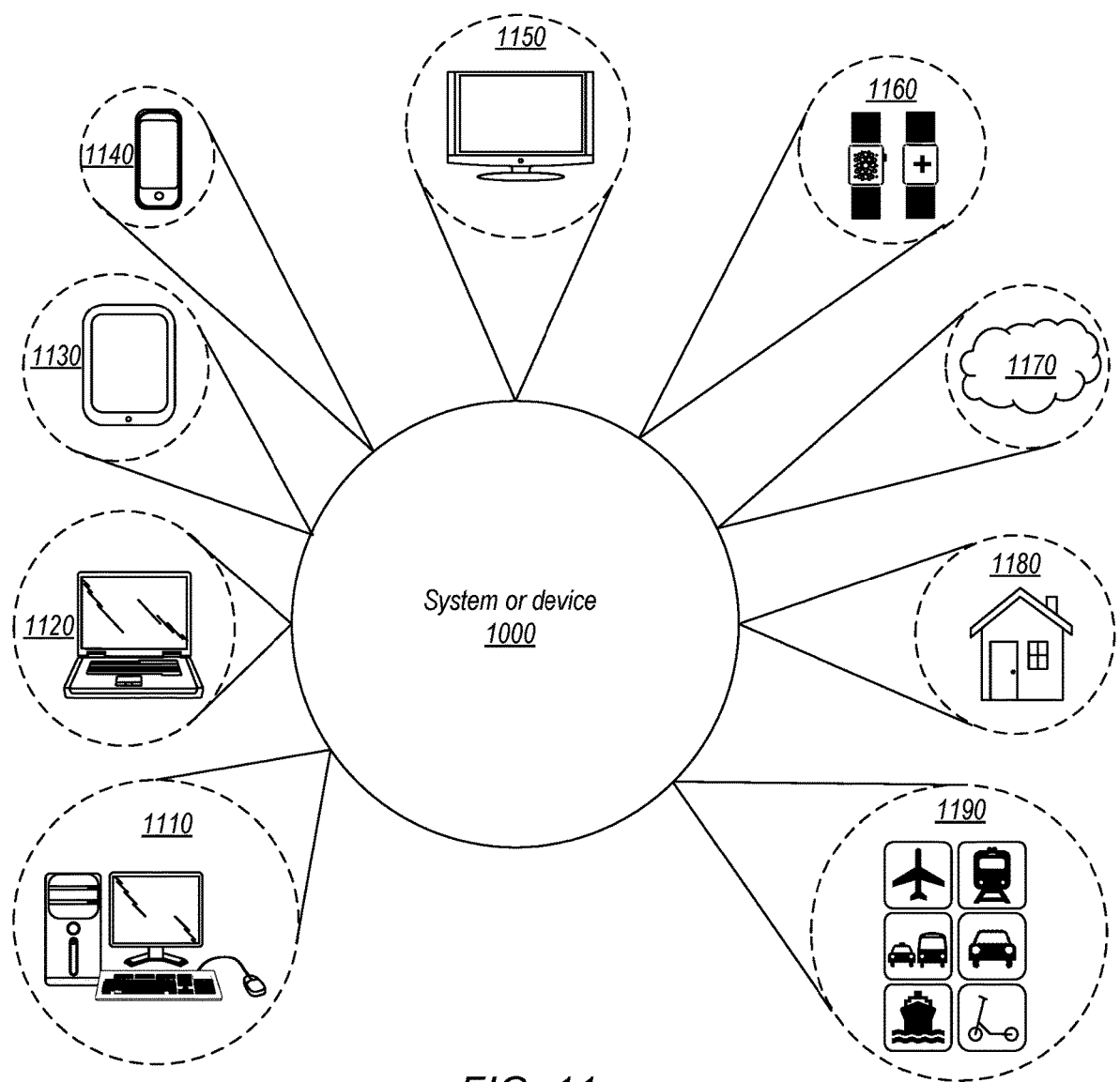
FIG. 11 is a block diagram of various embodiments of computer systems that may include output driver circuits.

Turning now to FIG. 11, various types of systems that may include any of the circuits, devices, or systems discussed above are illustrated. System or device 1100, which may incorporate or otherwise utilize one or more of the techniques described herein, may be utilized in a wide range of areas. For example, system or device 1100 may be utilized as part of the hardware of systems such as a desktop computer 1110, laptop computer 1120, tablet computer 1130, cellular or mobile phone 1140, or television 1150 (or set-top box coupled to a television).

Similarly, disclosed elements may be utilized in a wearable device 1160, such as a smartwatch or a health-monitoring device. Smartwatches, in many embodiments, may implement a variety of different functions—for example, access to email, cellular service, calendar, health monitoring, etc. A wearable device may also be designed solely to perform health-monitoring functions, such as monitoring a user's vital signs, performing epidemiological functions such as contact tracing, providing communication to an emergency medical service, etc. Other types of devices are also contemplated, including devices worn on the neck, devices implantable in the human body, glasses or a helmet designed to provide computer-generated reality experiences such as those based on augmented and/or virtual reality, etc.

System or device 1100 may also be used in various other contexts. For example, system or device 1100 may be utilized in the context of a server computer system, such as a dedicated server or on shared hardware that implements a cloud-based service 1170. Still further, system or device 1100 may be implemented in a wide range of specialized everyday devices, including devices 1180 commonly found in the home such as refrigerators, thermostats, security cameras, etc. The interconnection of such devices is often referred to as the "Internet of Things" (IoT). Elements may also be implemented in various modes of transportation. For example, system or device 1100 could be employed in the control systems, guidance systems, entertainment systems, etc. of various types of vehicles 1190.

The applications illustrated in FIG. 11 are merely exemplary and are not intended to limit the potential future applications of disclosed systems or devices. Other example applications include, without limitation: portable gaming devices, music players, data storage devices, unmanned aerial vehicles, etc.

Figure 12:
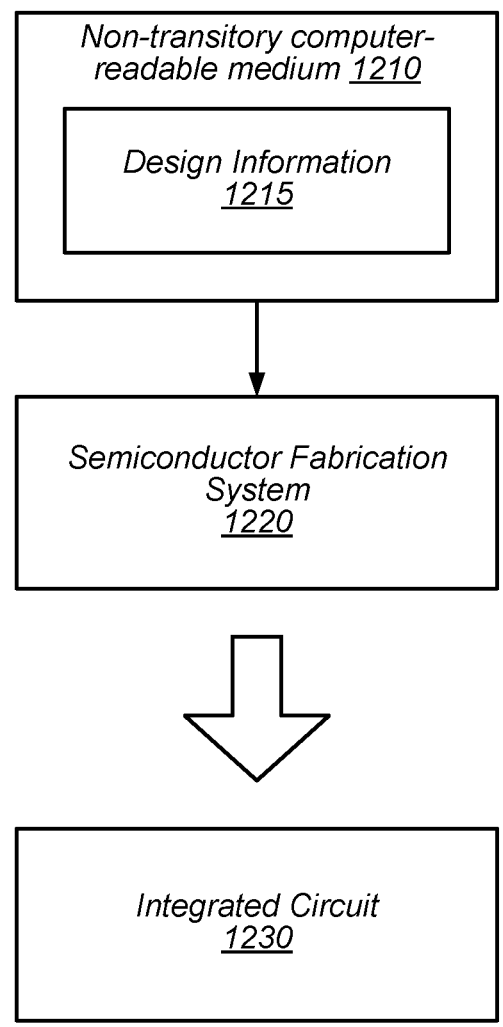
FIG. 12 illustrates an example of a non-transitory computer-readable storage medium that stores circuit design information.

FIG. 12 is a block diagram illustrating an example of a non-transitory computer-readable storage medium that stores circuit design information, according to some embodiments. In the illustrated embodiment, semiconductor fabrication system 1220 is configured to process design information 1215 stored on non-transitory computer-readable storage medium 1210 and fabricate integrated circuit 1230 based on design information 1215.

Non-transitory computer-readable storage medium 1210, may comprise any of various appropriate types of memory devices or storage devices. Non-transitory computer-readable storage medium 1210 may be an installation medium, e.g., a CD-ROM, floppy disks, or tape device; a computer system memory or random-access memory such as DRAM, DDR RAM, SRAM, EDO RAM, Rambus RAM, etc.; a non-volatile memory such as Flash, magnetic media, e.g., a hard drive, or optical storage; registers, or other similar types of memory elements, etc. Non-transitory computer-readable storage medium 1210 may include other types of non-transitory memory as well or combinations thereof. Non-transitory computer-readable storage medium 1210 may include two or more memory mediums, which may reside in different locations, e.g., in different computer systems that are connected over a network.

Design information 1215 may be specified using any of various appropriate computer languages, including hardware description languages such as, without limitation: VHDL, Verilog, SystemC, SystemVerilog, RHDL, M, MyHDL, etc. Design information 1215 may be usable by semiconductor fabrication system 1220 to fabricate at least a portion of integrated circuit 1230. The format of design information 1215 may be recognized by at least one semiconductor fabrication system, such as semiconductor fabrication system 1220, for example. In some embodiments, design information 1215 may include a netlist that specifies elements of a cell library, as well as their connectivity. One or more cell libraries used during logic synthesis of circuits included in integrated circuit 1230 may also be included in design information 1215. Such cell libraries may include information indicative of device or transistor level netlists, mask design data, characterization data, and the like, of cells included in the cell library.

Integrated circuit 1230 may, in various embodiments, include one or more custom macrocells, such as memories, analog or mixed-signal circuits, and the like. In such cases, design information 1215 may include information related to included macrocells. Such information may include, without limitation, schematics capture database, mask design data, behavioral models, and device or transistor level netlists. As used herein, mask design data may be formatted according to graphic data system (GDSII), or any other suitable format.

Semiconductor fabrication system 1220 may include any of various appropriate elements configured to fabricate integrated circuits. This may include, for example, elements for depositing semiconductor materials (e.g., on a wafer, which may include masking), removing materials, altering the shape of deposited materials, modifying materials (e.g., by doping materials or modifying dielectric constants using ultraviolet processing), etc. Semiconductor fabrication system 1220 may also be configured to perform various testing of fabricated circuits for correct operation.

In various embodiments, integrated circuit 1230 is configured to operate according to a circuit design specified by design information 1215, which may include performing any of the functionality described herein. For example, integrated circuit 1230 may include any of various elements shown or described herein. Further, integrated circuit 1230 may be configured to perform various functions described herein in conjunction with other components. Further, the functionality described herein may be performed by multiple connected integrated circuits.

As used herein, a phrase of the form "design information that specifies a design of a circuit configured to . . . " does not imply that the circuit in question must be fabricated in order for the element to be met. Rather, this phrase indicates that the design information describes a circuit that, upon being fabricated, will be configured to perform the indicated actions or will include the specified components.

The present disclosure includes references to "embodiments," which are non-limiting implementations of the disclosed concepts. References to "an embodiment," "one embodiment," "a particular embodiment," "some embodiments," "various embodiments," and the like do not necessarily refer to the same embodiment. A large number of possible embodiments are contemplated, including specific embodiments described in detail, as well as modifications or alternatives that fall within the spirit or scope of the disclosure. Not all embodiments will necessarily manifest any or all of the potential advantages described herein.

Unless stated otherwise, the specific embodiments are not intended to limit the scope of claims that are drafted based on this disclosure to the disclosed forms, even where only a single example is described with respect to a particular feature. The disclosed embodiments are thus intended to be illustrative rather than restrictive, absent any statements to the contrary. The application is intended to cover such alternatives, modifications, and equivalents that would be apparent to a person skilled in the art having the benefit of this disclosure.

Particular features, structures, or characteristics may be combined in any suitable manner consistent with this disclosure. The disclosure is thus intended to include any feature or combination of features disclosed herein (either explicitly or implicitly), or any generalization thereof. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

For example, while the appended dependent claims are drafted such that each depends on a single other claim, additional dependencies are also contemplated. Where appropriate, it is also contemplated that claims drafted in one statutory type (e.g., apparatus) suggest corresponding claims of another statutory type (e.g., method).

Because this disclosure is a legal document, various terms and phrases may be subject to administrative and judicial interpretation. Public notice is hereby given that the following paragraphs, as well as definitions provided throughout the disclosure, are to be used in determining how to interpret claims that are drafted based on this disclosure.

References to the singular forms such "a," "an," and "the" are intended to mean "one or more" unless the context clearly dictates otherwise. Reference to "an item" in a claim thus does not preclude additional instances of the item.

The word "may" is used herein in a permissive sense (i.e., having the potential to, being able to) and not in a mandatory sense (i.e., must).

The terms "comprising" and "including," and forms thereof, are open-ended and mean "including, but not limited to."

When the term "or" is used in this disclosure with respect to a list of options, it will generally be understood to be used in the inclusive sense unless the context provides otherwise. Thus, a recitation of "x or y" is equivalent to "x or y, or both," covering x but not y, y but not x, and both x and y. On the other hand, a phrase such as "either x or y, but not both" makes clear that "or" is being used in the exclusive sense.

A recitation of "w, x, y, or z, or any combination thereof" or "at least one of w, x, y, and z" is intended to cover all possibilities involving a single element up to the total number of elements in the set. For example, given the set [w, x, y, z], these phrasings cover any single element of the set (e.g., w but not x, y, or z), any two elements (e.g., w and x, but not y or z), any three elements (e.g., w, x, and y, but not z), and all four elements. The phrase "at least one of . . . w, x, y, and z" thus refers to at least one of element of the set [w, x, y, z], thereby covering all possible combinations in this list of options. This phrase is not to be interpreted to require that there is at least one instance of w, at least one instance of x, at least one instance of y, and at least one instance of z.

Various "labels" may proceed nouns in this disclosure. Unless context provides otherwise, different labels used for a feature (e.g., "first circuit," "second circuit," "particular circuit," "given circuit," etc.) refer to different instances of the feature. The labels "first," "second," and "third" when applied to a particular feature do not imply any type of ordering (e.g., spatial, temporal, logical, etc.), unless stated otherwise.

Within this disclosure, different entities (which may variously be referred to as "units," "circuits," other components, etc.) may be described or claimed as "configured" to perform one or more tasks or operations. This formulation—[entity] configured to [perform one or more tasks]—is used herein to refer to structure (i.e., something physical). More specifically, this formulation is used to indicate that this structure is arranged to perform the one or more tasks during operation. A structure can be said to be "configured to" perform some task even if the structure is not currently being operated. Thus, an entity described or recited as "configured to" perform some task refers to something physical, such as a device, circuit, memory storing program instructions executable to implement the task, etc. This phrase is not used herein to refer to something intangible.

The term "configured to" is not intended to mean "configurable to." An unprogrammed FPGA, for example, would not be considered to be "configured to" perform some specific function. This unprogrammed FPGA may be "configurable to" perform that function, however.

Reciting in the appended claims that a structure is "configured to" perform one or more tasks is expressly intended not to invoke 35 U.S.C. § 112(f) for that claim element. Should Applicant wish to invoke Section 112(f) during prosecution, it will recite claim elements using the "means for" [performing a function] construct.

The phrase "based on" is used to describe one or more factors that affect a determination. This term does not foreclose the possibility that additional factors may affect the determination. That is, a determination may be solely based on specified factors or based on the specified factors as well as other, unspecified factors. Consider the phrase "determine A based on B." This phrase specifies that B is a factor that is used to determine A or that affects the determination of A. This phrase does not foreclose that the determination of A may also be based on some other factor, such as C. This phrase is also intended to cover an embodiment in which A is determined based solely on B. As used herein, the phrase "based on" is synonymous with the phrase "based at least in part on."

The phrase "in response to" describes one or more factors that trigger an effect. This phrase does not foreclose the possibility that additional factors may affect or otherwise trigger the effect. That is, an effect may be solely in response to those factors, or may be in response to the specified factors as well as other, unspecified factors. Consider the phrase "perform A in response to B." This phrase specifies that B is a factor that triggers the performance of A. This phrase does not foreclose that performing A may also be in response to some other factor, such as C. This phrase is also intended to cover an embodiment in which A is performed solely in response to B.

What is claimed is:

1. An apparatus, comprising:
   a power supply port of an integrated circuit, wherein the power supply port is coupled to an internal power supply node via a first resistor;
   a driver circuit configured to generate, using a data signal and a voltage level of a regulated power supply node, an output signal on a signal port of the integrated circuit;
   a first protection circuit configured to couple the signal port to the internal power supply node in response to a detection of an electrostatic discharge event on the signal port; and
   a second protection circuit coupled to the internal power supply node, wherein the second protection circuit is configured, in response to the detection of the electrostatic discharge event, to increase a voltage level of an input to the driver circuit, wherein the second protection circuit includes a first diode coupled between a ground supply node and the input to the driver circuit, a second diode coupled between the internal power supply node and the input to the driver circuit, and a second resistor coupled between the regulated power supply node and the input to the driver circuit.

2. The apparatus of claim 1, wherein to generate the output signal on the signal port, the driver circuit is further configured to sink a current from the signal port, wherein a value of the current is based on the data signal and the voltage level of the regulated power supply node.

3. The apparatus of claim 1, further comprising a power supply clamp circuit configured to couple the internal power supply node to the ground supply node in response to the detection of the electrostatic discharge event.

4. The apparatus of claim 3, wherein the power supply clamp circuit comprises a field effect transistor (FET) coupled between the internal power supply node and the ground supply node, and wherein, during the electrostatic discharge event, the FET is configured to activate to provide a current path between the internal power supply node and the ground supply node.

5. The apparatus of claim 1, wherein the second protection circuit includes the first diode coupled between the ground supply node and a first circuit node, the second diode coupled between the internal power supply node and the first circuit node, the second resistor coupled between the regulated power supply node and the first circuit node, and a device coupled between the first circuit node and the input to the driver circuit, wherein a control terminal of the device is coupled to the internal power supply node.

6. The apparatus of claim 1, further comprising a voltage regulator circuit configured to generate a particular voltage on the regulated power supply node.

7. A method, comprising:
generating, by a driver circuit, an output signal on a signal port of an integrated circuit using a voltage level of a regulated power supply node;
coupling, by a first protection circuit, the signal port to an internal power supply node of the integrated circuit in response to detecting an electrostatic discharge event, wherein the internal power supply node is coupled to a power supply port of the integrated circuit via a resistor;
increasing, by a second protection circuit coupled to the internal power supply node, a voltage level of an input to the driver circuit in response to detecting the electrostatic discharge event; and
coupling, by the second protection circuit using a diode, the regulated power supply node to a ground supply node in response to detecting the electrostatic discharge event.

8. The method of claim 7, further comprising generating, by a voltage regulator circuit, a particular voltage on the regulated power supply node using a voltage level of the power supply port.

9. The method of claim 7, further comprising coupling, by a power clamp circuit, the internal power supply node to the ground supply node in response to detecting the electrostatic discharge event.

10. The method of claim 9, further comprising increasing, by the second protection circuit, the voltage level of the input to the driver circuit using current drawn from the ground supply node.

11. The method of claim 10, further comprising routing the current drawn from the ground supply node to the power supply port.

12. The method of claim 9, wherein coupling the internal power supply node to the ground supply node in response to detecting the electrostatic discharge event comprises activating a field effect transistor (FET), of the power clamp circuit, coupled between the internal power supply node and the ground supply node in response to the electrostatic discharge event.

13. The method of claim 7, wherein generating the output signal on the signal port, includes sinking, by the driver circuit, a current from the signal port, wherein a value of the current is based on a data signal and the voltage level of the regulated power supply node.

14. An apparatus, comprising:
a first integrated circuit coupled to a circuit board; and
a second integrated circuit coupled to the circuit board and coupled to the first integrated circuit via a conductive trace, wherein the second integrated circuit includes an output circuit configured to:
generate an output signal on a signal port coupled to the conductive trace, using a device coupled to the signal port, wherein a control terminal of the device is coupled to a regulated power supply node included in the second integrated circuit;
couple the signal port to an internal power supply node of the second integrated circuit in response to a detection of an electrostatic discharge event, wherein the internal power supply node is coupled to a power supply port of the second integrated circuit via a resistor; and
increase a voltage level of an input to the control terminal of the device in response to detecting the electrostatic discharge event;
wherein the output circuit includes a diode configured to couple the regulated power supply node to a ground supply node in response to detecting the electrostatic discharge event.

15. The apparatus of claim 14, wherein the output circuit is further configured to generate a particular voltage on the regulated power supply node using a voltage level of the power supply port.

16. The apparatus of claim 15, wherein the output circuit is further configured to couple the internal power supply node to the ground supply node included in the second integrated circuit in response to the detection of the electrostatic discharge event.

17. The apparatus of claim 16, wherein the output circuit is further configured to increase the voltage level of the input to the control terminal of the device using current drawn from the ground supply node.

18. The apparatus of claim 17, wherein the output circuit is further configured to route the current drawn from the ground supply node to the power supply port.

19. The apparatus of claim 14, wherein to generate the output signal on the signal port, the output circuit is further configured to sink a current from the signal port, wherein a value of the current is based on a data signal and the voltage level of the regulated power supply node.

20. The apparatus of claim 14, wherein the second integrated circuit further includes a power clamp circuit comprising a field effect transistor (FET) coupled between the internal power supply node and the ground supply node, and wherein, during the electrostatic discharge event, the FET is configured to activate to provide a current path between the internal power supply node and the ground supply node.

* * * * *